United States Patent [19]
Rinne et al.

[11] Patent Number: 6,147,583
[45] Date of Patent: Nov. 14, 2000

[54] TRANSFORMER ASSEMBLY

[75] Inventors: Karl Rinne, Ardmore; Joe Duigan, Killeagh; Brian Gaynor, Youghal; Frank Keane, Dungarvan; Sean Spelman, Glanmire, all of Ireland

[73] Assignee: Artesyn Technologies, Youghal, Ireland

[21] Appl. No.: 09/318,809

[22] Filed: May 26, 1999

[30] Foreign Application Priority Data

May 26, 1998 [IE] Ireland ................................. S98 0404
May 26, 1998 [IE] Ireland ................................. S98 0405

[51] Int. Cl.$^7$ ........................................................ H01F 5/00
[52] U.S. Cl. ............................ 336/200; 336/223; 336/232
[58] Field of Search ..................................... 336/200, 223, 336/232

[56] References Cited

U.S. PATENT DOCUMENTS

| | | | |
|---|---|---|---|
| 4,914,561 | 4/1990 | Rice et al. | 363/126 |
| 5,321,380 | 6/1994 | Godek et al. | 336/232 |
| 5,694,104 | 12/1997 | Lindberg | 336/183 |
| 5,929,733 | 7/1999 | Anzawa et al. | 336/61 |

FOREIGN PATENT DOCUMENTS

| | | |
|---|---|---|
| 0267108 | 5/1988 | European Pat. Off. . |
| 0318955 | 6/1989 | European Pat. Off. . |
| 1510084 | 5/1978 | United Kingdom . |
| 2252208 | 7/1992 | United Kingdom . |
| 2285892 | 7/1995 | United Kingdom . |

*Primary Examiner*—Michael L. Gellner
*Assistant Examiner*—Anh Mai
*Attorney, Agent, or Firm*—Jacobson, Price, Holman & Stern, PLLC

[57] ABSTRACT

A transformer (1) for a printed circuit board (2) is provided with physically separate flat metal windings (6) which are chosen to take the highest or the two highest currents handled by the transformer (1). The lower currents which will often include the power input to the primary are printed on the surfaces (3,4) of the printed circuit board (2). The flat metal windings (5) may be pre-assembled with the core halves (6,7).

19 Claims, 4 Drawing Sheets

TRANSFORMER ASSEMBLY

BACKGROUND OF THE INVENTION

1. Field of the Invention

The present invention relates to a transformer for mounting on a printed circuit board having high current and low current windings. Further, the invention relates to transformers which can be used on a printed circuit board to provide a gate drive voltage source for field effect transistors such as MOSFETs, or indeed other circuit signals.

2. Background Information

It has long been appreciated that stand alone transformers when mounted on printed circuit boards are very bulky and project too far above the circuit board so that various other techniques have been proposed to provide transformers and like devices that could be positioned more closely to the board and not project too far above the board. At the same time, it is essential that the transformer have good electrical characteristics and specifically low AC resistance and good magnetic coupling.

It is known to provide a planar transformer which includes a multilayer printed circuit board with a primary winding etched on one surface of the printed circuit board and a secondary winding etched on another surface. Such etching and forming is generally referred to simply as "printing" and thus is the term used in this specification. Such as planar transformer is described in British Patent Specification No. 2252208 (Burr-Brown Corporation). Unfortunately, such a transformer can have difficulties in relation to basic insulation. It is generally not suitable for automated assembly and its electrical performance is not as good as it should be. European Patent Specification No. 318,955 (John Fluke Manufacturing Co. Inc.) shows a similar power transformer.

British Patent Specification No. 2285892 (Advanced Power Conversion Limited) illustrates another such transformer in which the secondary winding is printed on the circuit board and the primary winding is provided on an auxiliary printed circuit board or substrate.

However, none of these have sufficiently good electrical properties, although the European Patent Specification No. 0 318 955 does refer to the need for better permeability so as to provide a flux path with the lowest reluctance. However, it is suggested that these constructions do not achieve the sane characteristics as more conventionally constructed transformers. Further, many of these power transformers are used on printed circuit boards which supply power for driving field effect transistors (FETs) for use as fast acting switches in synchronous rectifier applications. Essentially, synchronous rectifiers are an effective method for increasing converter efficiency and what is essential is to be able to condition an available signal into an appropriate form for driving the MOSFET at the appropriate voltage. The problem is that in many situations and power applications there is a transformer whose characteristics are determined by the remainder of the circuit and thus the use of the transformer as part of the driving circuit of such field effect transistors is to a certain extent a side issue. They are often not that efficient for that purpose.

A particular problem arises as is often the case when one of the windings has to handle relatively high currents. The power handling capabilities of printed windings is often inadequate.

OBJECTS

The present invention is directed towards providing an improved construction of transformer which will have the advantages detailed above and which will go some way to obviating the disadvantages of present constructions of transformer for mounting on printed circuit boards.

SUMMARY OF THE INVENTION

According to the invention, there is provided a transformer of the type hereinbefore described in which the low current winding is a printed winding on the board and the high current winding a physically separate winding formed from a flat metal sheet having integral terminals. An advantage of this is that greatly improved coupling factors are obtained and indeed typical coupling factors obtained with flat metal sheet winding are in the region of 0.01% to 0.1% compared with coupling factors of the order of 10 times this for ordinary wire wound transformers.

Ideally, there are two metal sheets, one on either side of the board, forming the high current winding. These may form two separate high current windings and thus give flexibility to the design.

Generally, the printed circuit board is a multi-layer board and the printed winding is printed on a plurality of surfaces of the printed circuit board. This can allow the provision of a plurality of low current windings.

Ideally, the printed winding incorporates an auxiliary winding for modified voltage output for other parts of the circuit of the printing circuit board and this winding may be a fractional winding. Indeed, more than one auxiliary winding may be provided which may or may not be a fractional winding. Ideally, the auxiliary winding is used as a gate drive voltage source for field effect transistors for the control of timing signals for the circuit of the printed circuit board and for other uses.

In a preferred embodiment of the invention, the printed circuit board has through holes for reception of the core and in which the core comprises two separate core halves for mounting on the two outermost surfaces of the board and means for releasably securing the core halves together for mounting on the board. It has been found ideal to make each separate winding and a core half as a preformed unit which aids assembly.

Ideally, the high current winding is insulated.

BRIEF DESCRIPTION OF THE DRAWINGS

The invention will be more clearly understood from the following description of some embodiments thereof given by way of example only with reference to the accompanying drawings in which.

DESCRIPTION OF THE PREFERRED EMBODIMENTS

Figure 1:
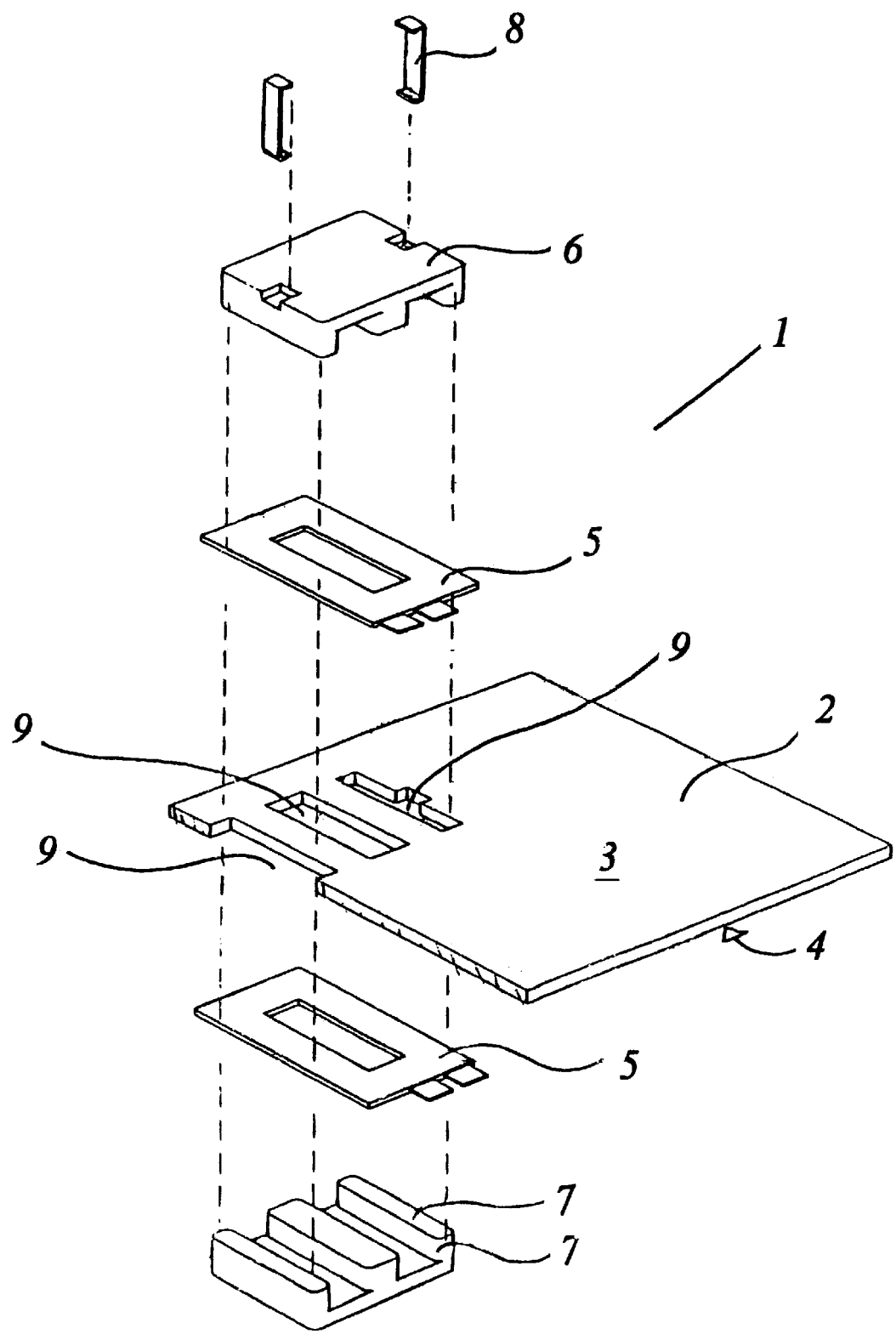
FIG. 1 is an exploded partially cut-away view of a transformer assembly according to the invention.
Figure 2:
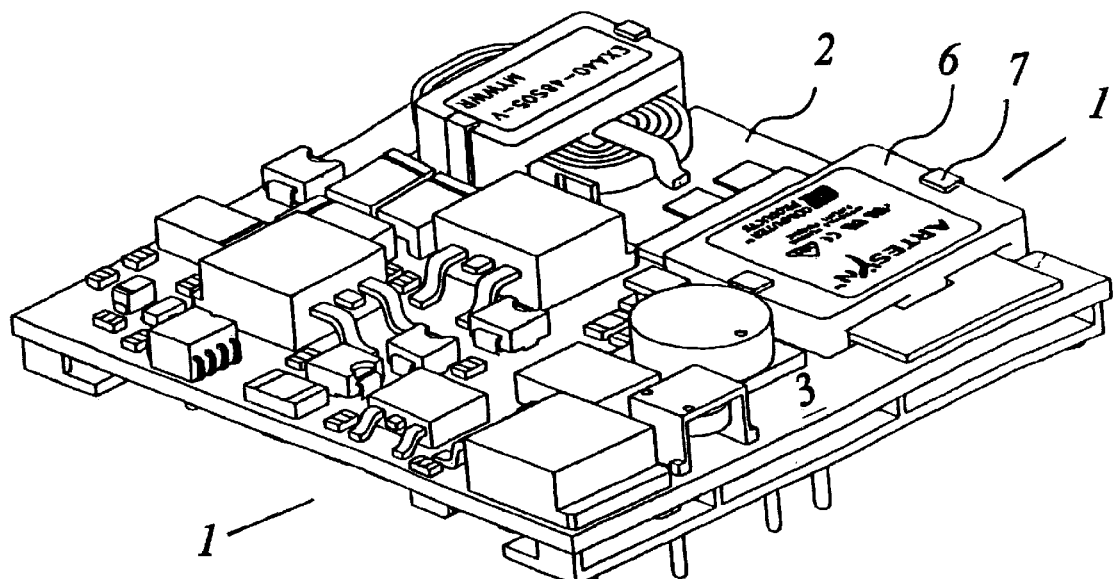
FIG. 2 is a top view of the final transformer assembly on a printed circuit board.
Figure 3:
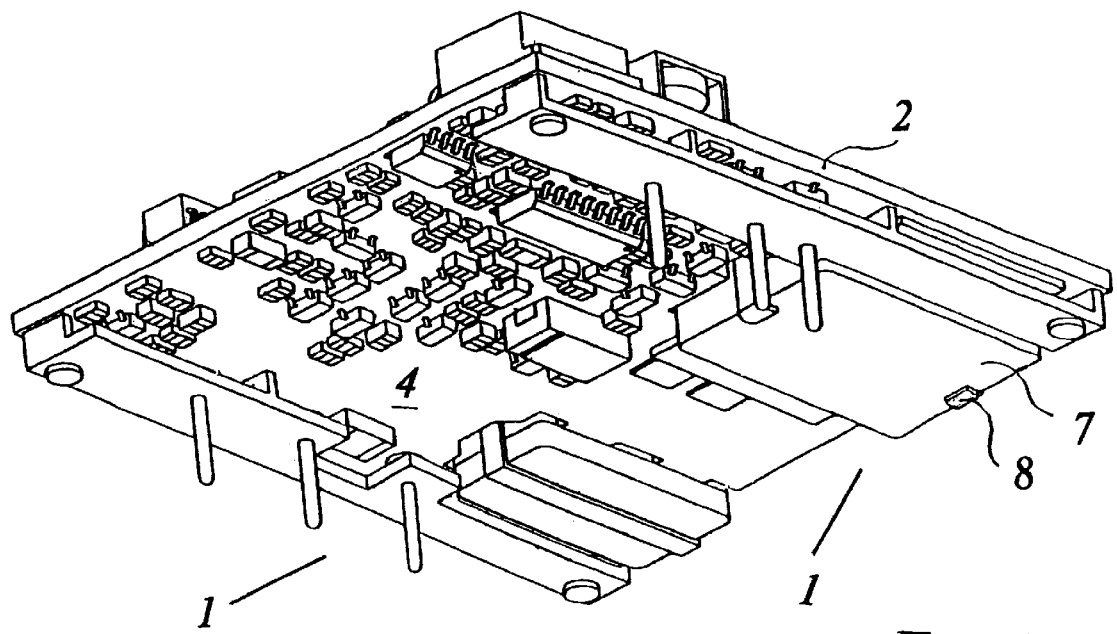
FIG. 3 is an underneath view of the transformer assembly on a printed circuit board.

Before discussing the invention in detail, it is advantageous to consider the problem being solved by the present invention and the solution proposed. In most transformers used on printed circuit boards and in particular on multilayer circuit boards, there is usually a considerable step down between the input voltage and the voltage output of the secondary windings and usually one, sometimes two, of the secondary windings carry most of the load and thus, due to the step down in voltage, this secondary winding or windings carry high currents. In certain cases, it would step up the voltage and the primary would carry the largest current or if the step down was not very large, it might be that one of the secondary windings and the primary winding, namely, the input winding, would carry the most current Referring to the drawings and initially to FIGS. 1 to 5 thereof, there is provided a tansformer assembly indicated generally by the reference numeral 1 formed on a printed circuit board 2 only part of which is shown. The printed circuit board 2 will more often be a multi-layer board and while only a single layer board is illustrated, the following description does not distinguish between single and multilayer boards, the only difference is the number of surfaces which can be printed on. Thus, for simplicity, only one layer is referred to in most of the description. The circuit board 2 has printed thereon on its top layer 3 and its bottom layer 4 low current windings not shown. These low current windings could, for example, if it was a single board as illustrated, be the primary winding and one auxiliary secondary winding. In a multilayer board, there could be a large number of secondary windings as well as the one primary winding printed. A pair of high current windings 5 are provided as is a core in two halves, namely, an upper core half 6 and a lower core half 7. In this particular embodiment and presuming that it is a step down transformer, then these two high current windings form the one secondary winding and as explained above, it will be appreciated that they could be separate windings forming two secondary windings or alternatively a secondary and primary winding. Clips 8 are provided as is core mounting means formed by core receiving through holes 9 in the printed circuit board 2. The printed windings are of conventional construction and thus do not require illustration or description.

Figure 4:
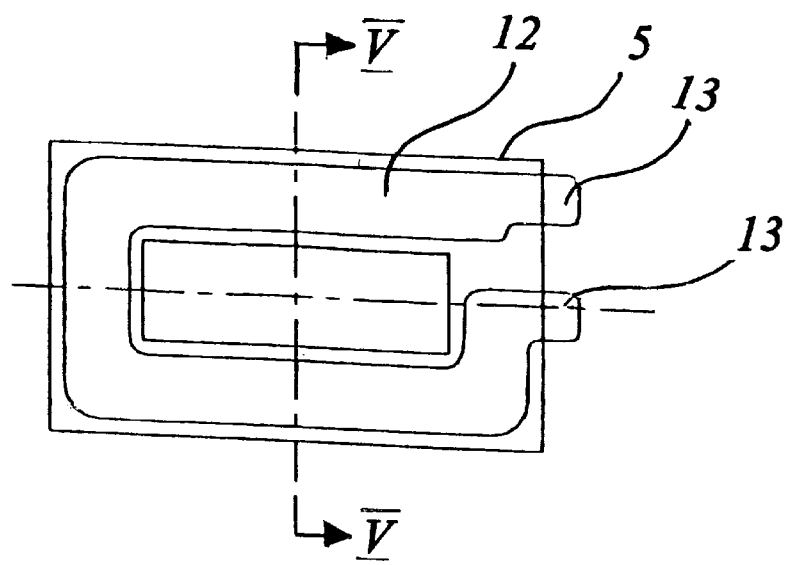
FIG. 4 is a plan view of the transformers secondary windings.
Figure 5:
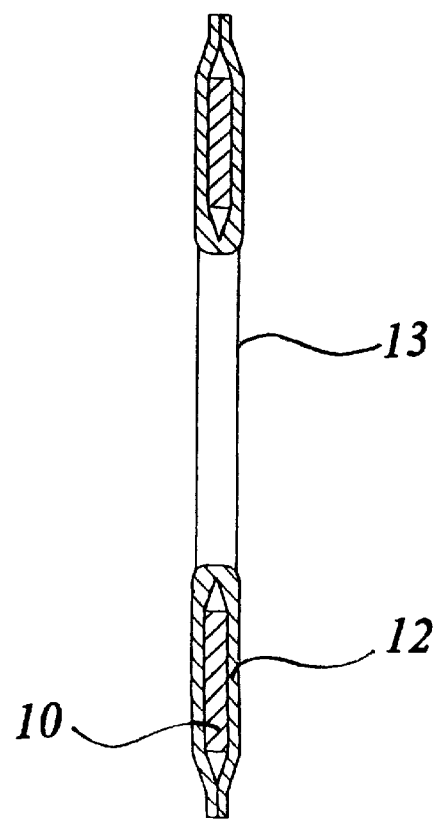
FIG. 5 is a sectional view in the direction of the arrows V—V of FIG. 4.

Referring to FIGS. 4 and 5, there is illustrated the high current winding 5 which comprises an inner core of a metal sheet 10, in this case copper, surrounded by insulation material 12 terminating in terminals 13 (see FIG. 4). The terminals 13 are cut or shaped out of the metal sheet 10 and are thus integral therewith. This provides good connectivity with inexpensive formation, it will be appreciated that the high current windings may be secured to the printed circuit board by conventional surface mounting techniques.

To make the transformer assembly 1 the primary windings are printed on all inner layers and the upper and lower surfaces 3 and 4 respectively of the printed circuit board (2) and the high current windings 5 and core halves 6 and 7 are offered up to the board and secured by the clips 8. This can be readily easily seen from FIG. 1.

Similarly the core halves 6 and 7 may be automatcally glued together after having been placed using surface mount equipment.

The insulation 12 used could for example be capton tape or any such similar insulating material as is well known in the art.

It is also envisaged for ease of assembly that the high current winding 5 would be secured to both the upper core half 6 and the lower core half 7 prior to assembly as preformed units. Thus, in this embodiment, the high current windings could be easily bonded to the core and then the two core halves clipped together so as to sandwich the printed windings therebetween. It will be appreciated that the core now projects only half the distance above the board and indeed projects slightly less than that due to the fact that the some of the windings are now incorporated in the printed circuit board.

By effectively making one set of windings and the core as one unit the assembly of the transformer is further facilitated.

Figure 6:
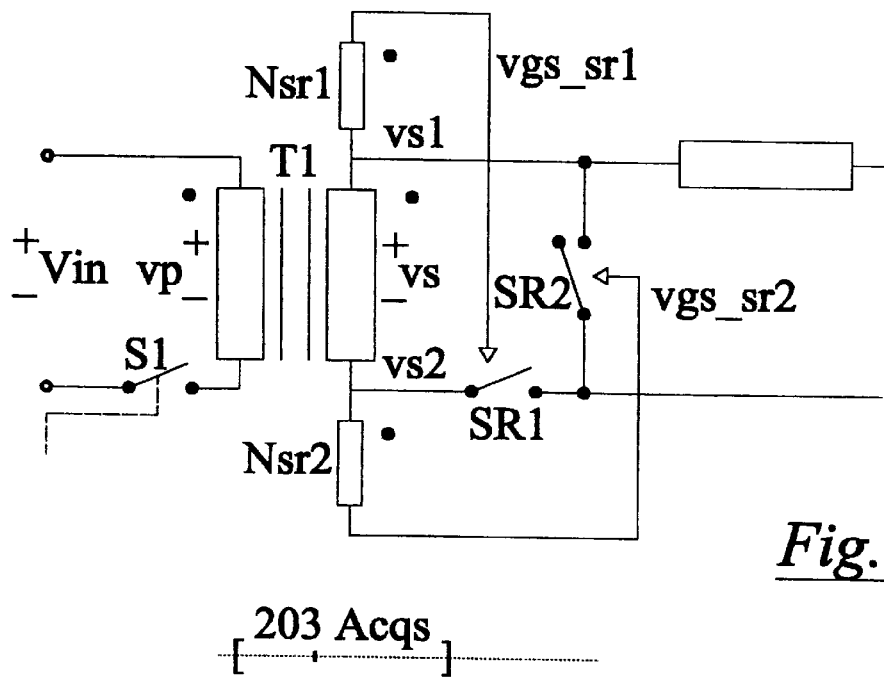
FIG. 6 is a circuit diagram of a generic converter illustrating the invention.

Before discussing the other important aspect of the present invention, it is necessary to make reference to FIG. 6. The half turn windings of FIGS. 6 and 7 can be easily achieved with the printed circuit board and while this has been proposed heretofore its implementation has not been that efficient it will be appreciated that it is possible with a multilayer board to print a plurality of main low current windings and one or more auxiliary windings which may have fractional windings depending on the voltage output required. Thus, many output voltages may be provided which be exactly matched to the requirements of various components of the printed circuit such as, for example, the gate drive voltage source for field effect transistors or timing signals. Again, the construction of the transformer with its superior characteristics achieves this and can handle more easily and thus with less variations in voltage output input voltage variations. By ensuring that the input power is adequately and efficiently handled the output voltage is more easily controlled.

Thus in FIG. 6, there is illustrated a power transformer T1 having a primary voltage input indicated by the letters VP and a secondary voltage output indicated by the letters VS from primary main high current windings P and secondary main low current windings S. All of this is a transformer who's charactertcs are dictated however by the circuit Connected to the low current windings S are auxiliary low windings NSR1 and NSR2, both therefore providing two modified output voltages, namely Vgs-R1 and Vgs-SR2 which can be applied to two suitable synchronous rectifier (SR) MOSFETs SR1 and SR2 it will be appreciated that these half turn auxiliary low current windings NSR1 and NSR2 on the secondary side of the transformer T1 will be used to condition the voltages VS1 and VS2 for driving SR1 and SR2 appropriately. This can be readily easily seen from the circuit It will be appreciated that for low output voltage converters, for example, 2.5 volts and lower, these voltages are often too low to drive the synchronous rectifier MOSFETs sufficiently and unfortunately this is the voltage that is used in the circuit. The net effect of this would mean higher "on" resistance from the synchronous rectifier MOSFETs and thus more conduction losses. The problem again is, if full turns are implemented to modify the secondary windings, they will often be too much so that the synchronous rectifier MOSFETs will be overdriven which is very important particularly if it is a wide input voltage range converter.

It will be appreciated that either or both of the windings NSR1 and NSR2 can be implemented as half turns on the tansformer T1. In the present example, it will be noted that windings were implemented in a forward DC-DC converter.

Figure 7:
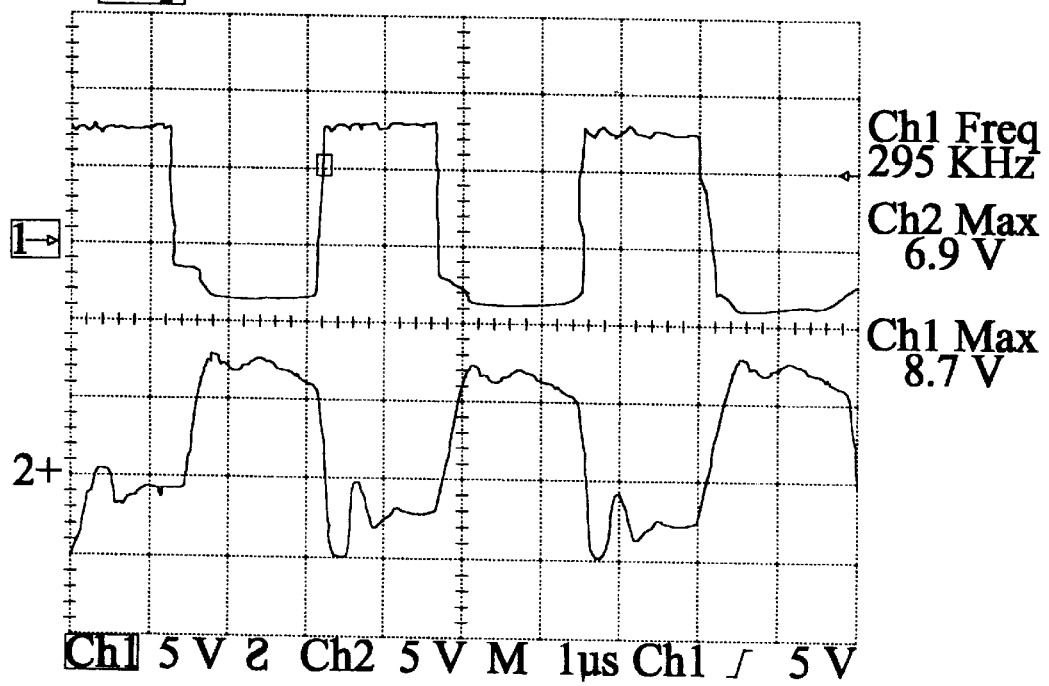
FIG. 7 is graphs of some gate drive wave forms of the circuit of FIG. 6.

Referring now to FIG. 7, the resultant wave forms VGS SR1 and VGS SR2 for the appropriate synchronous rectifiers are illustrated. It will be appreciated that both of the wave forms VGS SR1 and VGS SR2 are of suitable amplitude to drive n-channel power MOSFETs it has been found that the negative voltage exhibited by both wave forms serve to increase the turn-off drive to both synchronous rectifier MOSFETs.

Thus, with the present invention, there is provided a transformer with a high current winding which can handle large power inputs efficiently while the lower power requirements can be easily handled by printed windings.

It is advantageous to compare a typical low cost PCB transformer assembly with all the windings printed on the board and a planar transformer according to the present invention.

A typical low-cost 2 oz 4-layer PCB has a copper fill factor of roughly 4*70 $\mu$m/1.6 mm=17.5%. [Copper fill factor for a transformer is defined as the ratio of copper area to winding area].

The planar transformer using flat metal sheets uses the same technology 2 oz PCB (70 $\mu$m copper, 0.8 mm height), plus flat metal sheets (300 $\mu$m metal plus 50 $\mu$m insulation each side), resulting in a copper fill factor of roughly (2*70 $\mu$m+2*300 $\mu$m)/1.6 mm=46.3%.

A comparison shows that 2.6 times more copper can be incorporated in the transformer using flat metal sheet Winding losses will therefore be drastically reduced by more than 60% when compared to the PCB-only transformer.

Typical coupling factors obtained with the flat metal sheet transformer are in the region 0.01% . . . 0.1% compared to 0.1% . . . 1% of ordinary wire-wound transformers (i.e. a typical tan-fold increase of the coupling factor).

It has also been found that the thickness of the insulation required for the high current winding is not as great as would be expected. This leads to further reductions in space requirements in the winding area.

The core can be of any suitable construction such as E type described above or PQ-type, RM-type and so on.

In this specification, the terms "comprise", "comprises" and "comprising" are used interchangeably with the terms "include", "includes" and "including", and are to be afforded the widest possible interpretation and vice versa.

The invention is not limited to the embodiments hereinbefore described which may be varied within the scope of the claims.

What is claimed is:

1. A transformer comprising:
   a printed circuit board;
   a main low current winding comprising a printed winding for the transformer formed on the circuit board;
   a high current winding comprising a physically separate winding formed from a flat metal sheet and integral terminals formed by portion of the sheet;
   a core mounting means formed by core receiving through holes in the printed circuit board;
   a core formed from upper and lower core halves having portions extending respectively through the core receiving through holes and mounting the separate winding in register with the printed winding and in close contact therewith;
   means for connecting the core halves; and
   the printed winding incorporates an auxiliary winding for modified voltage output for other parts of a circuit of the printed circuit board.

2. A transformer as claimed in claim 1 in which there are two metal sheets, one on either side of the board, forming the high current winding.

3. A transformer as claimed in claim 1, in which there are two metal sheets, one on either side of the printed circuit board, forming two separate high current windings.

4. A transformer as claimed in claim 1, in which the printed circuit board is a multilayer board and the printed winding is printed on a plurality of surfaces of the printed circuit board.

5. A transformer as claimed in claim 1, in which there is a plurality of low current windings.

6. A transformer as claimed in claim 1, in which there are more than one printed winding which includes an auxiliary winding for modified voltage output for other parts of the circuit of the printing circuit board.

7. A transformer as claimed in claim 1, in which the printed winding incorporates an auxiliary winding for modified voltage output for other parts of the circuit of the printing circuit board and in which the auxiliary winding is used as a gate drive voltage source for field effect transistors.

8. A tansformer as claimed in claim 1, in which the printed winding incorporates an auxiliary winding for modified voltage output for other parts of the circuit of the printing circuit board and in which the auxiliary winding is used to control the timing signals for the circuit of the printed circuit board.

9. A transformer as claimed in claim 1 in which the printed circuit board has through holes for reception of the core and in which the core comprises two separate core halves for mounting on the two outermost surfaces of the board and means for releasably securing the core halves together for mounting on the board.

10. A transformer as claimed in claim 1 in which the printed circuit board has through holes for reception of the core and in which the core comprises two separate core halves for mounting on the two outermost surfaces of the board and means for releasably securing the core halves together for mounting on the board and in which the separate winding and a core half are a preformed unit.

11. A transformer comprising:
    a multi-layer printed circuit board;
    a main low current winding comprising a printed winding for the transformer formed on the circuit board;
    at least one auxiliary winding incorporated in the printed winding for modified voltage output for other parts of a circuit of the printed circuit board;
    a high current winding comprising a physically separate winding formed a flat metal sheet and integral terminals formed by portion of the sheet;
    a core mounting means formed by core receiving through holes in the printed circuit board;
    a core formed from upper and lower core halves having portions extending respectively through the core receiving through holes and mounting the separate winding in register with the printed winding and in close contact therewith; and
    means for connecting the core halves.

12. A transformer as claimed in claim 11 in which there is more than one low current winding, at least one of which incorporates an auxiliary winding for modified voltage output for other parts of the circuit of the printed circuit board, and in which the auxiliary winding is a fractional winding.

13. A transformer as claimed in claim 11 in which there are two metal sheets, one on either side of the board, forming the high current winding.

14. A transformer as claimed in claim 11 in which there are two metal sheets, one on either side of the printed circuit board, forming two separate high current windings.

15. A transformer as claimed in claim 11 in which there is a plurality of low current windings.

16. A transformer comprising:

a multi-layer printed circuit board;

a plurality of main low current windings printed on different layers of the printed circuit board;

at least one auxiliary low current winding printed on one of the layers of the printed circuit board said auxiliary low current winding having a current output different to that of the main low current windings for modified voltage output for other parts of the printed circuit board;

a core formed from upper and lower core halves having portions extending respectively through the core receiving through holes and mounting a separate winding in register with at least one main low current printed winding and in close contact therewith; and means for connecting the core halves.

17. A transformer as claimed in claim 16, in which the auxiliary winding is a fractional winding.

18. A transformer comprising:

a multi-layer printed circuit board;

a plurality of main low current windings printed on different layers of the circuit board;

a plurality of auxiliary low current windings printed on one of the layers of the printed circuit board said auxiliary low current printed windings having a current output different to that of the main low current windings for modified voltage output for other parts of the printed circuit board;

a core formed from upper and lower core halves having portions extending respectively through the core receiving through holes and mounting a separate winding in register with at least one main low current printed winding and in close contact therewith; and means for connecting the core halves.

19. A transformer as claimed in claim 18, in which one auxiliary winding is used as a gate drive voltage source for field effect transistors and another auxiliary winding is used to control the timing signals the printed circuit board.

* * * * *